(12) United States Patent
Cloutier et al.

(10) Patent No.: US 8,085,097 B2
(45) Date of Patent: Dec. 27, 2011

(54) INTEGRATED RAMP, SWEEP FRACTIONAL FREQUENCY SYNTHESIZER ON AN INTEGRATED CIRCUIT CHIP

(75) Inventors: Mark M. Cloutier, Gatineau (CA); Tudor Lipan, Ottawa (CA)

(73) Assignee: Hittite Microwave Corporation, Chelmsford, MA (US)

( * ) Notice: Subject to any disclaimer, the term of this patent is extended or adjusted under 35 U.S.C. 154(b) by 1 day.

(21) Appl. No.: 12/387,529

(22) Filed: May 4, 2009

(65) Prior Publication Data
US 2009/0278611 A1   Nov. 12, 2009

Related U.S. Application Data

(60) Provisional application No. 61/126,703, filed on May 6, 2008.

(51) Int. Cl.
*H03L 7/00* (2006.01)
*H03L 7/06* (2006.01)
*H03L 7/18* (2006.01)

(52) U.S. Cl. .................. 331/4; 331/16; 331/23
(58) Field of Classification Search .............. 331/1 A, 331/4, 16–18, 23, 25, 178; 327/156–159; 332/127; 342/199–201; 360/51; 375/376; 455/260

See application file for complete search history.

(56) References Cited

U.S. PATENT DOCUMENTS

| 4,965,533 | A | 10/1990 | Gilmore |
| 5,023,571 | A | 6/1991 | Fullmer et al. |
| 5,079,521 | A | 1/1992 | Gaskell et al. |
| 5,311,193 | A | 5/1994 | Parkes |
| 6,931,243 | B2 * | 8/2005 | Goldman .............. 455/260 |
| 7,098,754 | B2 | 8/2006 | Humphreys et al. |
| 2007/0236297 | A1 * | 10/2007 | Uozumi et al. .............. 331/16 |

OTHER PUBLICATIONS

Written Opinion from International Searching Authority, PCT/US2009/002778, dated Jun. 24, 2009, 5 pages (unnumbered).
M. Pichler et al., "Phase-Error Measurement and Compensation in PLL Frequency Synthesizers for FMCW Sensors-I: Context and Application", IEEE Transactions on Circuits and Systems, vol. 54, No. 5, May 2007, pp. 1006-1017.
M. Pichler et al., "Phase-Error Measurement and Compensation in PLL Frequency Synthesizers for FMCW Sensors-II: Theory", IEEE Transactions on Circuits and Systems, vol. 54, No. 6, Jun. 2007, pp. 1224-1235.

* cited by examiner

*Primary Examiner* — David Mis
(74) *Attorney, Agent, or Firm* — Iandiorio Teska & Coleman

(57) ABSTRACT

An integrated ramp, sweep fractional frequency synthesizer system on an integrated circuit chip includes an integrated circuit chip having a fractional frequency synthesizer with a fractional divider responsive to a VCO and a ΔΣ modulator for modifying the divisor of the fractional divider; and a ramp generator on the same integrated circuit chip; the ramp generator being responsive to a trigger signal to generate a ramp for sweeping the frequency of said fractional frequency synthesizer.

22 Claims, 3 Drawing Sheets

INTEGRATED RAMP, SWEEP FRACTIONAL FREQUENCY SYNTHESIZER ON AN INTEGRATED CIRCUIT CHIP

RELATED APPLICATIONS

This application claims benefit of and priority to U.S. Provisional Application Ser. No. 61/126,703, filed May 6, 2008 under 35 U.S.C. §§119, 120, 363, 365, and 37 C.F.R. §1.55 and §1.78 incorporated herein by this reference.

FIELD OF THE INVENTION

This invention relates to an integrated ramp, sweep fractional frequency synthesizer on an integrated circuit chip.

BACKGROUND OF THE INVENTION

The ramp generation function can be done using the direct digital synthesis (DDS) technique or using a phase locked loop (PLL) with variable reference frequency or variable voltage controlled oscillator (VCO) division ratio. The DDS approach requires a high performance DAC and smoothing filter, which makes it very difficult to build when high output frequencies and large variations are required.

Higher output frequencies can be generated using a PLL with a variable reference frequency, which is typically generated with a low frequency DDS, but since the PLL amplifies the spurs generated by the DDS by 20*log(N)—where N is the ratio of the VCO to the reference frequency, the DDS design becomes again very critical.

The latter approach, using an integrated PLL-based fractional frequency synthesizer with externally controlled VCO division ratio, is prone to introduce digital switching noise and add cost and complexity to the system. In the prior art case where a fractional N synthesizer is used with an external ramp controller, real time transfers of the frequency word are required to the PLL. This is problematic as it causes digital switching noise while the synthesizer is running, and it also uses more power in the inter-chip transactions and costs more than an integrated approach. Also the rate of change of the frequency may be limited by the serial port transfer speed, resulting in a less smooth ramp. One known method to generate a low frequency ramp, or 'chirp', signal is to use an all digital technique using a direct digital synthesizer (DDS), such as that used by Parkes (U.S. Pat. No. 5,311,193 1994). This idea is commonly extended to high frequencies by using the DDS as the reference for an integer PLL using a method such as Gilmore, (U.S. Pat. No. 4,965,533 1990). Both the low frequency and the high frequency methods of Parkes and Gilmore rely on a DDS based solution which has problems in that the all digital process can create many unwanted spurious signals when converted back to analog. Also the hardware complexity is significantly larger. Further the idea is restricted as the bandwidth of the PLL should be relatively narrow to reduce the DDS spurs, which creates larger linearity distortions at ramp start or stop. Another method disclosed in Gaskel et al. (U.S. Pat. No. 5,079,521 1992) uses a fractional synthesizer to generate frequencies of arbitrary values. Another common method to generate a ramped frequency at high carrier frequencies is to directly drive a VCO using a programmable voltage generator based on a high resolution DAC. This approach creates calibration problems due to the non-linear tuning characteristic of the VCO, cannot truly achieve linear frequency sweeps and is generally not suitable for large volume semiconductor manufacturing due to the difficulties in controlling the analog parameters involved in the ramp generation. This is especially true when large sweeps are needed or large temperature variations are encountered. All this prior art is incorporated herein by this reference.

SUMMARY OF THE INVENTION

In accordance with various aspects of the subject invention a new integrated ramp, sweep fractional frequency synthesizer is provided which reduces cost of external components, the overhead to control the ramp frequency. This invention provides significant improvement over the DDS approach which is limited in frequency operation, uses large amounts of power, is prone to spurious generation and costs more.

The invention results from the realization that, in part, an improved sweep fractional frequency synthesizer in various aspects can be achieved by the addition of an integrated ramp generator internal to the fractional frequency synthesizer integrated circuit on a single integrated circuit chip which drives in real time the frequency set-point of the $\Delta\Sigma$ modulator and generates up and/or down frequency ramps with programmable slope (step size and number) and/or dwell for automatic mode operation for repeated ramping whereby autonomous generation of the frequency ramp based on the programmed ramp data is achieved using either an external trigger or an internally self generated trigger to start the ramp.

The subject invention, however, in other embodiments, need not achieve all these objectives and the claims hereof should not be limited to structures or methods capable of achieving these objectives.

This invention features an integrated ramp, sweep fractional frequency synthesizer system on an integrated circuit chip including an integrated circuit chip having a fractional frequency synthesizer with a fractional divider responsive to the frequency of a VCO and a modulator for modifying the divisor of the fractional divider. There is a ramp generator on the same integrated circuit chip which is responsive to a trigger signal to generate a ramp for sweeping the frequency of the fractional frequency synthesizer.

In preferred embodiments the ramp generator may include a look-up table containing a number of different shaped ramps. The ramp generator may include a ramp controller containing a programmed number of ramp steps and step sizes and being responsive to a trigger signal to generate a ramp shape. The ramp generator may include a calculator circuit for calculating one or more different ramp shapes. The calculator circuit may calculate exponential, parabolic or other ramp shapes. The ramp controller may include a single mode for generating a single ramp upon each trigger signal. The ramp controller may include an automatic mode for enabling repeated ramping upon a single trigger signal and is further programmed with a dwell time to define a repetition period. The on-chip fractional frequency synthesizer may include a loop filter, a charge pump for driving the loop filter and a phase frequency detector, responsive to a reference and the fractional divider, for detecting any deviation between the reference and a VCO driven by the loop filter to develop a compensation signal to enable the loop filter to converge the VCO output with the reference. A serial or parallel interface circuit may be provided on the integrated circuit chip for receiving off-chip commands to program the ramp controller. The modulator may be a delta-sigma ($\Delta\Sigma$) type or any other type of fractional modulator. The modulator includes a modulator core responsive to the fractional portion of the ramp controller output and an integer delay path circuit responsive to the integer portion of the ramp controller output to synchronize the integer and fractional outputs from the modulator to the fractional divider. The integer delay path circuit may include a delay circuit responsive to the integer portion of the ramp controller output and a summing circuit for combining the delayed integer portion and the fractional output of the modulator core. The ramp may be a simple ramp extending in a single direction. The ramp may be a compound ramp extending in a number of directions. The ramp may be a compound ramp extending in at least a first direction and a second generally opposite direction. The trigger signal may be hardware generated from an input pin. The trigger signal may be software generated from a serial or parallel interface. The trigger signal may be an auto-mode sweep trigger signal. The trigger signal may be a bi-directional mode sweep trigger signal. The trigger signal may be a single mode sweep trigger signal. The trigger signal may be a dual mode trigger signal.

This invention also features an integrated fractional modulator, integrated ramp generator and integrated SPI or parallel interface on the same chip, where any of the other synthesizer components may be on or off chip, including the fractional divider, charge pump, phase detector, loop filter, and VCO and where the charge pump is optional if an active loop filter is used.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
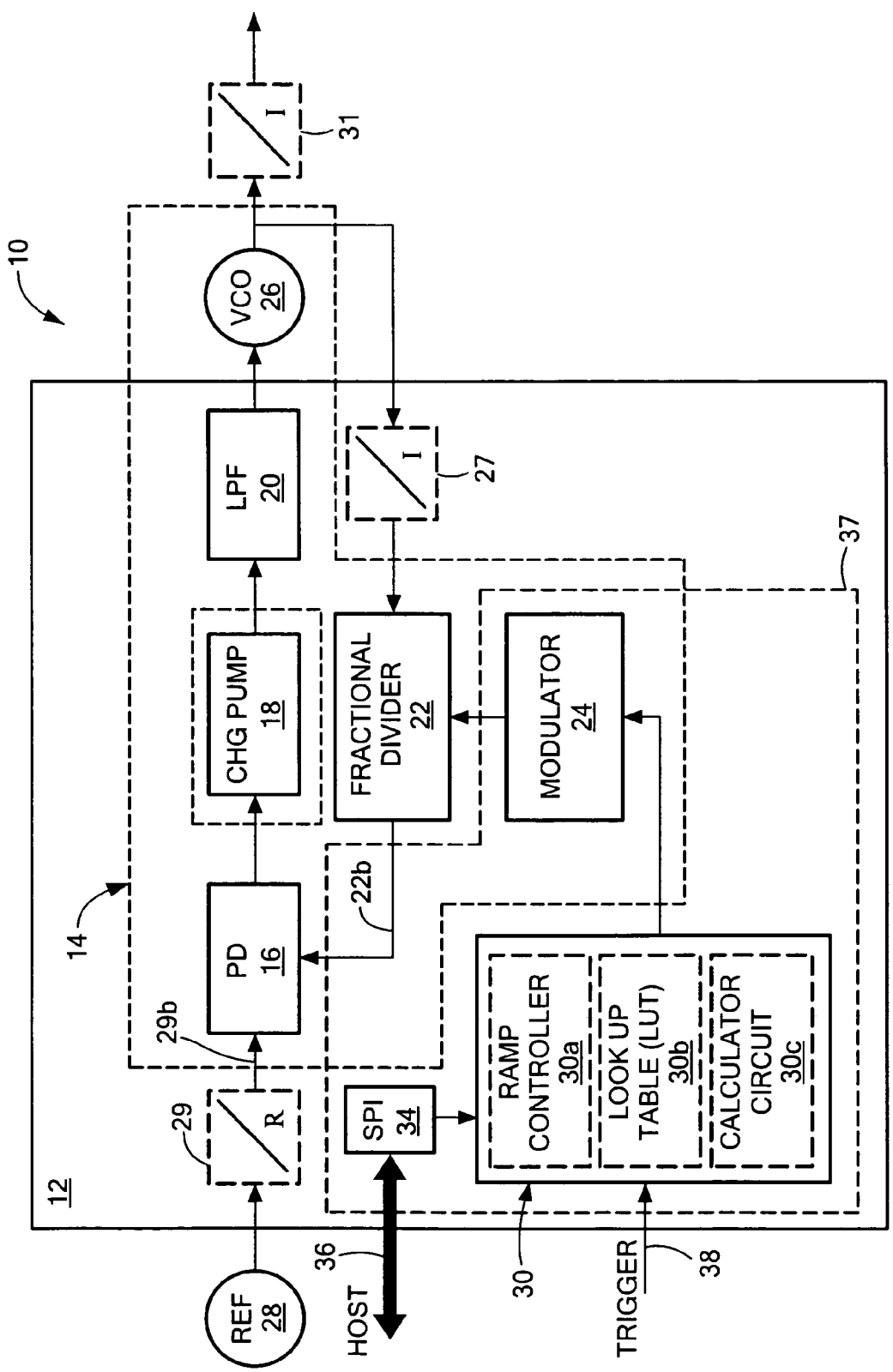
FIG. 1 is a schematic block diagram of an integrated ramp sweep fractional frequency synthesizer system on an integrated circuit chip according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The invention is accomplished by adding an integrated controller and ramp circuit both of which are on-chip with the rest of the fractional frequency synthesizer to facilitate the generation of the frequency control ramp based solely on the programmed ramp data and either an external trigger or internally self generated trigger to start the ramp. The ramp, once triggered, automatically provides the required control words to the fractional divider in order to produce a linear or other desired ramp waveform, all of this is integrated with the fractional frequency synthesizer on a single integrated chip and without the further assistance of a DDS or real time data transfers.

There is shown in FIG. 1 an integrated ramp, sweep fractional frequency synthesizer system 10 on an integrated circuit chip 12. Integrated ramp sweep fractional frequency synthesizer system 10 includes a conventional frequency synthesizer 14 including a phase frequency detector 16, optional charge pump 18, loop filter 20, fractional divider 22, modulator 24 and VCO 26 which operate in a conventional way. Other variations such as programmable integer dividers 27 and 31 and inclusion or exclusion charge pump 18 are also possible. The PD 16, R divider 29, optional charge pump 18, fractional divider 22, loop filter 20, VCO 26, or the dividers 27 and 31 may be internal or external to the integrated sweeper.

In operation the output of VCO 26 is fed back to fractional divider 22 which divides the VCO frequency output by some number, for the sake of simplicity say 100. That is, fractional divider 22 has a divisor of 100. The output from fractional divider 22 is compared in the phase detector (PD) 16 to a reference signal from reference source 28 and optional reference divider 29. If the phase frequency detector 16 detects that VCO 26 output frequency $22b$ is lower than the reference 28 frequency $29b$ then PD 16 increases the charge from charge pump 18 to loop filter 20 and loop filter 20 increases the voltage to VCO 26 to drive up its output frequency. Charge pump 18 and loop filter 20 may be replaced by an op amp and active filter. If, on the other hand, PD 16 determines that the output of VCO 26 has a higher frequency $22b$ than reference 28 signal $29b$, then PD 16 causes charge pump 18 to lower the charge delivered to loop filter 20 which in turn lowers the voltage to VCO 26 and drops its output frequency. Since frequency synthesizer 14 is a fractional frequency synthesizer there is some means, such as modulator 24 to cause the fractional effect. This is done conventionally by modulator 24 periodically altering the divisor in fractional divider 22. For example, with a divisor of 100 being applied by divider 22, ΔΣ modulator 24 may add a one every ten cycles. Thus fractional divider 22 uses a divisor of 100 nine out of ten cycles and on the tenth cycle uses a divider of 101. This causes the average output of fractional output divisor to be no longer 100 but to be 100.1. This is a simplified example with a very rough fractional introduction. In reality, the sequence of VCO divisors generated by the sigma-delta modulator is more complex, in order to achieve the required frequency resolution and to reduce spurious outputs.

In accordance with this invention ramp generator 30 is added on the same integrated chip 12 as the modulators 24 and the interface controller 34. Ramp generator 30 may be implemented with a ramp controller $30a$, look-up table $30b$ or calculator $30c$. Calculator $30c$ may be used to calculate various ramp shapes e.g. exponential, parabolic. Look-up table $30b$ may be used to store many different arbitrary ramp shapes. Ramp controller $30a$ in single mode operation provides the frequency step size, and the number of steps per ramp. The update rate is equal to the PD (16, FIG. 1) comparison frequency ($29b$, FIG. 1), but may not be limited to it. In an automatic mode the Ramp controller $30a$ provides those inputs as well as a dwell input. The ramp signal thus generated by ramp controller $30a$ along with ΔΣ modulator 24 drives fractional divider 22 to sweep across a range of frequencies which makes the sweep fractional frequency synthesizer useful to generate chirp signals for radar applications and for instrumentation and laboratory equipment, for example. Ramp controller $30a$ may be loaded with the proper step size, number of steps, and driven by an interface, such as, serial/parallel interface (SPI) 34, which receives the input from a host processor on line 36 from a source off-chip. Ramp controller $30a$ is operated by a trigger on line 38 to enable ramp controller $30a$ to produce the ramp.

The ramp controller $30a$ is configured directly from the host with the ramp parameters (i.e. step size, number of steps, dwell time, ramp points in a look-up table, parameters to calculate a parabolic or other ramp shape, operating mode (int/ext trigger, autorepeat, single-step etc), and, once started, it generates the ramping set-point of the sigma-delta with no other external intervention. The ramp controller 30a is implemented as a regular state-machine, and an infinity of particular embodiments can lead to the same functionality. The components in dashed box 37 are those essential to be integrated on the chip. The others are optionally includable on the chip.

Figure 2:
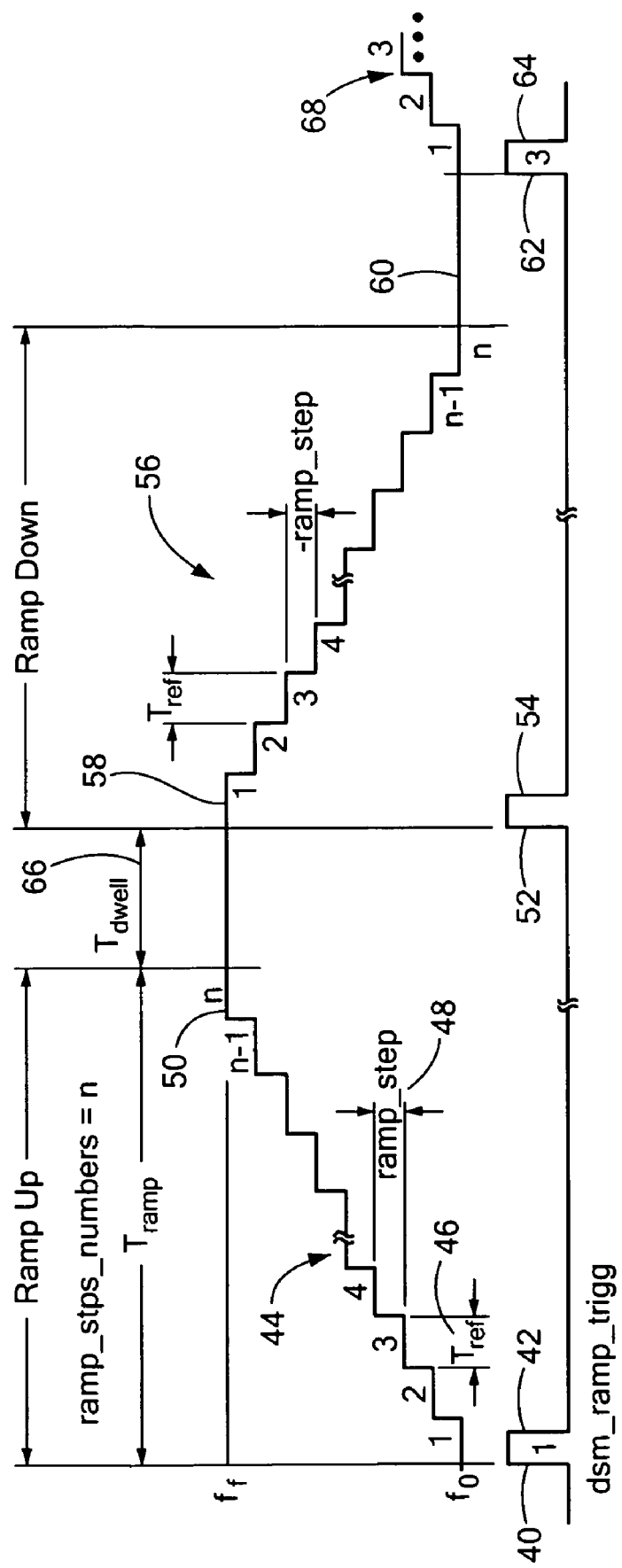
FIG. 2 illustrates one type of ramp generated by the ramp generator of FIG. 1.

A typical linear ramp is shown in, FIG. 2. This concept is not limited to any ramp shape, and in its most general form is a look-up table 30b of numbers preloaded by the host processor. The improvement is the fact that the frequency updates are located internal to the integrated chip 14, and real time data transfer is not required once the "ramp" starts. In the single mode of operation the positive going edge 40 of a trigger pulse 42 starts an up ramp 44 beginning at starting frequency $f_0$ and having a number of steps n. Each step has a width ($T_{ref}$) 46 generated by the signal at 29b and a height 48 as commanded by ramp generator 30 e.g. ramp controller 30a which also sets the number of steps. The width 46 and height 48 of the steps define the slope of ramp 44 as well. The height 48 of the steps and the number of steps are all provided by ramp controller 30. When the nth step 50 is reached at frequency $f_f$ there are no more steps and the system dwells at the final frequency $f_f$ level until the leading edge 52 of the next trigger pulse 54. In this example, ramp 56 is a down ramp beginning with the first step 58 at frequency $f_f$ and continuing for n steps back down to the nth step 60 at frequency $f_0$ where it rests until the positive going edge 62 of the next trigger pulse 64. This is the single mode operation. In the automatic mode operation ramp controller 30 provides a dwell time ($T_{dwell}$) as indicated at 66 in FIG. 2. Also in the automatic mode there is only one trigger pulse 42: there are no trigger pulses after that. That is, trigger pulse 54 and 64 and so on do not occur. Rather ramp controller 30a automatically starts the ramp with the rising edge 40. After ramp 44 reaches the nth step 50 at frequency $f_f$, the programmed dwell period ($T_{dwell}$) 66 occurs after which the system automatically begins the second ramp 56 without the application of any more pulses 54, 64.

This explanation of the single mode and automatic mode operation shows an up ramp 44 followed by a down ramp 56 followed by another up ramp 68 and so on. However, this is not a limitation of the invention for either in the single mode or automatic mode of operation the ramps may be all up ramps, all down ramps or they may start as a down ramp followed by an up ramp, followed by a down ramp, etc. Also, the slope when ramping up may not necessarily be equal with the slope when ramping down. For example, in either mode there may be an up ramp 44 followed by a rapid return from $f_f$ to $f_0$ followed by another up ramp, followed by another rapid return from $f_f$ to $f_0$ followed by another up ramp and so on. Or, the system may start with a down ramp beginning at $f_f$ ending at $f_0$ and nearly instantaneously returning to $f_f$ and beginning a down ramp again and over and over again. And as indicated previously instead of an up ramp 44 followed by a down ramp 56, followed by an up ramp 68, the system may provide the mirror image of a down ramp, followed by an up ramp, followed by a down ramp and so on. Various triggering schemes may be used for ramp generator 30, for example, the trigger signal may be hardware originated such as on line 38 or it may be software generated e.g. through SPI 39. Further the trigger may be in single, dual or more complex form for controlling auxiliary mode, one way ramp or two or more ramps or sweeps.

Ramp parameters are fully programmable through the serial interface 34. However, the synthesized ramp is subject to normal phase lock dynamics. If the loop band width in use is much wider than the rate of the steps, then the locking will be very fast relative to the step rate and the ramp will have a staircase shape. Since the rate of change is the reference frequency, this situation does not typically exist in practice. If the update rate is higher than the loop bandwidth, as is normally the case, then the loop will not fully settle before a new frequency step is received. Hence, after a transient the swept output will follow the set point with a small constant lag and will sweep in a near continuous fashion. Therefore, right after the ramp is triggered, small ramp non-linearities may appear temporarily at the input. A pre-distortion digital filter 70, FIG. 3, may be introduced between ramp generator 30 and $\Delta\Sigma$ modulator 24 to reduce the transient distortion, if necessary. However, since the pre-distortion depends also on the actual external loop filter components, the design of a general pre-distortion digital filter is not trivial. Fortunately, the presence of this filter is not normally needed in practice. A simple practical solution to avoid the start-up transient problem is to start the ramp earlier at a lower frequency (assuming ramping up) and ignore the first part of it.

Figure 3:
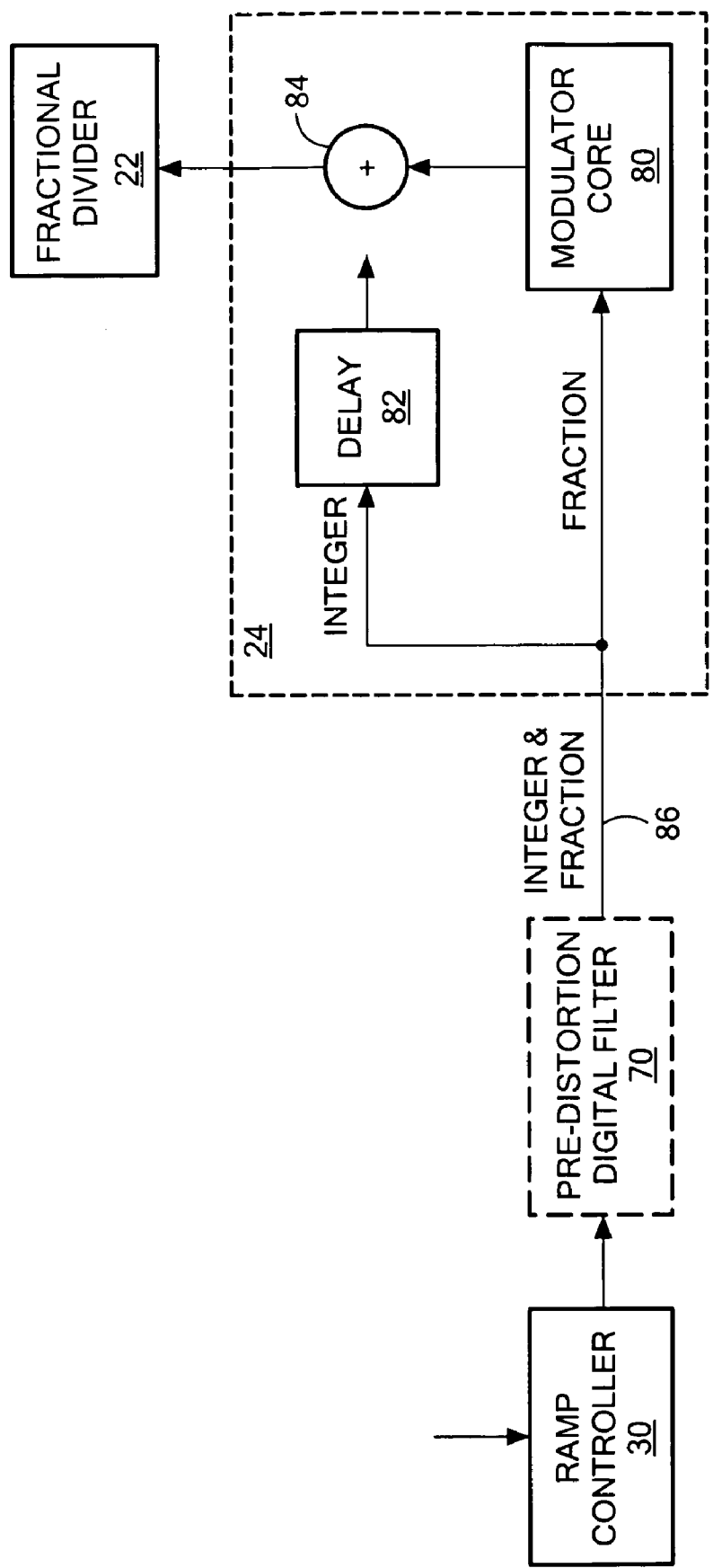
FIG. 3 is a more detailed schematic diagram of an embodiment of the modulator of FIG. 1 and an optional pre-distortion digital filter.

The set point of $\Delta\Sigma$ modulator 24 is incremented/decremented by a ramp step, in the single mode every reference cycle. The start frequency, step size, including width and height, and the number of steps are programmed via the serial interface 34. Note, however, that the integer path and the fractional path passing through the $\Delta\Sigma$ transfer function have different delays. The integer path which normally is added directly to the sequence at the output of the modulator core, should be artificially delayed to compensate the fractional signal path delay through the modulator. This is shown in FIG. 3, where modulator 24 includes the modulator core 80, a delay 82, and an adder or summing circuit 84. The output from ramp controller 30 includes both an integer and fraction part as indicated on line 86. The fractional part goes directly to modulator core 80 whose output is delivered to adder or summer 84; the integer portion, however, goes to delay circuit 82 which may typically delay the integer information for three cycles, for example, to match the delay in modulator core 80. The output of delay 82 is then combined with the output from modulator core 80 in adder 84 and provided to fractional divider 22 as explained previously.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An integrated ramp, sweep fractional frequency synthesizer system with a fractional divider, the synthesizer system comprising:
an integrated circuit chip including a plurality of elements of a fractional frequency synthesizer including a modulator for modifying the divisor of said fractional divider; a ramp generator on the same integrated circuit chip; said ramp generator being responsive to a trigger signal to generate a ramp for sweeping the frequency of said fractional frequency synthesizer; and an interface circuit responsive to an external controller, to control the ramp generator and modulator.

2. The integrated ramp, sweep fractional frequency synthesizer of claim 1 in which said fractional divider is on said integrated circuit chip.

3. The integrated ramp, sweep fractional frequency synthesizer of claim 1 in which said ramp generator includes a look-up table containing a number of different shaped ramps.

4. The integrated ramp, sweep fractional frequency synthesizer of claim 1 in which said ramp generator includes a ramp controller containing a programmed number of ramp steps and step sizes and being responsive to a trigger signal to generate a ramp shape.

5. The integrated ramp, sweep fractional frequency synthesizer of claim 1 in which said ramp generator includes a calculator circuit for calculating one or more different ramp shapes.

6. The integrated ramp, sweep fractional frequency synthesizer of claim 1 in which said calculator circuit calculates exponential or parabolic ramp shapes.

7. The integrated ramp, sweep fractional frequency synthesizer system of claim 4 in which said ramp controller includes a single mode for generating a ramp upon each trigger signal.

8. The integrated ramp, sweep fractional frequency synthesizer system of claim 4 in which said ramp controller includes an automatic mode for enabling repeated ramping upon a single trigger signal and is further programmed with a dwell time to define a repetition period.

9. The integrated ramp, sweep fractional frequency synthesizer system of claim 1 in which said fractional frequency synthesizer also has integrated on the chip the fractional divider for dividing a voltage controlled oscillator (VCO) feedback path, a loop filter, a charge pump for driving said loop filter and a phase frequency detector, for detecting any deviation between a reference and VCO, a VCO driven by said loop filter to develop a compensation signal to enable the loop filter to converge the VCO output with the reference, a fixed divider to condition the VCO signal, and a reference path divider.

10. The integrated ramp, sweep fractional frequency synthesizer system of claim 4 wherein said interface includes a serial or parallel interface circuit on said integrated circuit chip for receiving off-chip commands to program said ramp controller.

11. The integrated ramp, sweep fractional frequency synthesizer system of claim 4 in which said modulator includes a modulator core responsive to a fractional portion of said ramp controller output and an integer delay path circuit responsive to an integer portion of said ramp controller output to synchronize an integer and a fractional outputs from said modulator to said fractional divider.

12. The integrated ramp, sweep fractional frequency synthesizer system of claim 11 in which said integer delay path circuit includes a delay circuit responsive to the integer portion of said ramp controller output and a summing circuit for combining the delayed integer portion and the fractional output of said modulator core.

13. The integrated ramp, sweep fractional frequency synthesizer system of claim 1 in which said ramp is a simple ramp extending in a single direction.

14. The integrated ramp, sweep fractional frequency synthesizer system of claim 1 in which said ramp is a compound ramp extending in a number of directions.

15. The integrated ramp, sweep fractional frequency synthesizer system of claim 1 in which said ramp is a compound ramp extending in at least a first direction and a second generally opposite direction.

16. The integrated ramp, sweep fractional frequency synthesizer system of claim 1 in which said trigger signal is hardware generated from an input pin.

17. The integrated ramp, sweep fractional frequency synthesizer system of claim 1 in which said trigger signal is software generated from a serial/parallel interface (SPI).

18. The integrated ramp, sweep fractional frequency synthesizer system of claim 1 in which said trigger signal is an auto-mode sweep trigger signal.

19. The integrated ramp, sweep fractional frequency synthesizer system of claim 1 in which said trigger signal is a bi-directional mode sweep trigger signal.

20. The integrated ramp, sweep fractional frequency synthesizer system of claim 1 in which said ramp generator has a single step mode where each trigger advances said sweep by one step per trigger.

21. The integrated ramp, sweep fractional frequency synthesizer of claim 1 in which the modulator is of $\Delta\Sigma$ type.

22. A fractional frequency synthesizer system with a frequency sweeper integrated on a chip including an integrated modulator, an integrated ramp generator for generating a ramp to sweep the frequency of said fractional frequency synthesizer and an integrated serial/parallel interface (SPI) or parallel interface on the same chip, where any of other synthesizer components selected from any of a fractional divider, a charge pump, a phase detector, a loop filter, and a voltage controlled oscillator (VCO) are located on or off the chip.

* * * * *